US006791350B2

(12) United States Patent
Taguchi

(10) Patent No.: US 6,791,350 B2
(45) Date of Patent: Sep. 14, 2004

(54) INSPECTION METHOD FOR ARRAY SUBSTRATE AND INSPECTION DEVICE FOR THE SAME

(75) Inventor: Tomoyuki Taguchi, Siga-ken (JP)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 09/917,959

(22) Filed: Jul. 30, 2001

(65) Prior Publication Data

US 2002/0017917 A1 Feb. 14, 2002

(30) Foreign Application Priority Data

Aug. 3, 2000 (JP) ....................................... 2000-235505

(51) Int. Cl.[7] ................................................ G01R 31/00
(52) U.S. Cl. ........................ 324/770; 324/765; 345/204
(58) Field of Search .............................. 324/765, 158.1, 324/73.1, 750–770; 438/14, 17, 18; 345/204, 904, 87; 349/64, 192, 139

(56) References Cited

U.S. PATENT DOCUMENTS 5,377,030 A * 12/1994 Suzuki et al. ............... 349/187
5,428,300 A * 6/1995 Takahashi et al. .......... 324/770
6,275,061 B1 * 8/2001 Tomita ....................... 324/770

* cited by examiner

*Primary Examiner*—Kamand Cuneo
*Assistant Examiner*—Jimmy Nguyen
(74) *Attorney, Agent, or Firm*—Scully, Scott, Murphy & Presser; Robert M. Trepp, Esq.

(57) ABSTRACT

Disclosed are an inspection method for a disconnection of a storage capacitor line and an inspection device for the same in an inspection of an array substrate used in a liquid crystal display apparatus. An inspection method for an array substrate is constituted, in which a quantity of charges stored in the storage capacitor becomes C ($Vd_1-Vcs_1$) by supplying simultaneously a pulse signal Vd and a pulse signal Vcs to the storage capacitor from a signal line and a Cs line on a TFT array substrate, and an influence of the disconnection of the Cs line is taken into consideration when the above-described quantity of charges is detected in a reading circuit. Note that the above-described inspection is performed not for all the storage capacitors, but for one storage capacitor in each Cs line. Thus, the inspection for all the Cs lines in liquid crystal panels from 14 inch diagonal to 18 inch diagonal is terminated in about 1 to 2 seconds.

16 Claims, 6 Drawing Sheets

(a)

(b)

INSPECTION METHOD FOR ARRAY SUBSTRATE AND INSPECTION DEVICE FOR THE SAME

BACKGROUND OF THE INVENTION

1. Technical Field

The present invention relates to an inspection method for an array substrate used in a liquid crystal display apparatus and an inspection device for the same, more particularly to a disconnection inspection method for storage capacitor lines on a TFT array substrate and a disconnection inspection method for the same.

2. Prior Art

As shown in FIG. 8(*a*), in a thin film transistor (TFT) array substrate, signal lines 15 and gate lines 21 are wired in the form of matrix on a glass substrate while crossing to each other in an electrically nonconductive state, and TFTs 22 are arranged in the vicinity of cross portions thereof. The above-described gate line 21 and signal line 15 are respectively connected to a gate and a source of a TFT 22. A transparent electrode (ITO) is connected to a drain of the TFT 22. A storage capacitor electrode 25 is arranged so as to be opposite to a specified portion 23 of the transparent electrode, and a storage capacitor (Cs) 24 is constituted of the specified portion 23 of the transparent electrode and the storage capacitor electrode 25. In the case of a storage capacitor system, the storage capacitor electrode 25 is connected to storage capacitor drives circuit through a storage capacitor line (hereinafter referred to as a Cs line) 13. An arrangement of the respective lines and electrodes or the like described above on the TFT array substrate is performed by repeating a patterning process on the glass substrate.

In recent years, a length of each of the above-described lines has become longer owing to a larger screen of the liquid crystal display apparatus, and each of the above-described lines has become thinner owing to high definition of the liquid crystal display apparatus. This results in a higher probability of occurrence of defective articles due to a line disconnection or the like, when the above-described patterning process forms each line. Therefore, an inspection of the TFT array substrate is performed to prevent the defective articles from entering the subsequent manufacturing process in the case where the defective articles occur. For the inspection, a TFT array tester generally available in a market is used. The TFT array tester is capable of inspecting a disconnection (open circuit), a short circuit and a defective resistance of each line, a pixel defect or the like.

In the disconnection inspection of each line by using the above-described TFT array tester, using the above-described TFT array tester has not performed the disconnection inspection for the Cs line 13. This is because the Cs line 13 is short and defects of the Cs line 13 due to disconnection are difficult to be detected even if a lighting test is executed for a small panel of 12 inch diagonal or less using the storage capacitor system, and because a structure shown in FIG. 9(*a*) without the Cs line 13 (drive capacitor system) is adopted in most liquid crystal display panels of 14 inch diagonal or larger. Since this drive capacitor system does not wire the Cs line 13, there are advantages that the probability of occurrence of defective articles is reduced and an aperture ratio of the liquid crystal display apparatus is improved.

However, when the liquid crystal display has higher definition and a larger size, wiring of the gate line 21 becomes longer and a line width thereof becomes thinner, resulting in a larger resistance of the wiring. Moreover, since the number of the signal lines 15 is large, capacitance at a cross portion of the signal line 15 and the gate line 21 increases. As a result, a load to a gate driver outputting a gate drive signal becomes larger. Furthermore, in the drive capacitor system, since the storage capacitor electrode 25 of the storage capacitor 24 is connected to the gate line 21 of a front or rear step thereof, both of the gate signal and the signal to the storage capacitor electrode 25 exist mixedly in the gate line 21, and a quantity of charges that can be stored in the storage capacitor 24 is relatively small in comparison with the storage capacitor system.

Because of the reason described above, recently in the liquid crystal display panel of 14 inch diagonal or larger, the storage capacitor system using the Cs line 13 as shown in FIG. 9(*b*) has been increasingly adopted. Therefore, when the storage capacitance system is used in the liquid crystal display panel of 14 inch diagonal or larger, the Cs line 13 is included. Accordingly, if the Cs line 13 is disconnected, the disconnection of the Cs line 13 is detected by the lighting test. However, the lighting test is performed after the liquid crystal display panel is assembled. Therefore, it is more waste less and preferable that the disconnection of the Cs line 13 be detected at a stage where TFT array substrates are manufactured, and that defective TFT array substrates are not allowed to enter the subsequent process.

The TFT array tester inspecting a disconnection, a short circuit and a defective resistance of each line, a pixel defect or the like of the TFT array substrate cannot detect the disconnection of the Cs line 13. The tester supplies a pulse signal Vd as shown in FIG. 10 to the signal line 15 while supplying a constant voltage Vcs to the Cs line 13. By supplying the constant voltage Vcs to the Cs line 13, the voltage Vcs is applied to the storage capacitor electrode 25. Note that, in the above-described pulse signal Vd, since the falling of the pulse signal Vd occurs after the gate signal is turned off, and does not have a relation to a potential difference in the storage capacitor 24, the pulse signal Vd falls in an optional time.

And, as shown in FIG. 10, the gate signal is applied from the gate line 21 to the TFT 22 at the time $t_0$ to turn the TFT 22 to an ON state, thus the pulse signal Vd is applied from the signal line 15 to the specified portion of the transparent electrode 23 of the storage capacitor 24 having a capacitance of C. Moreover, at the time $t_1$, the TFT 22 is turned to an OFF state by turning off the gate signal. When the voltage of the pulse signal Vd at this time is set as $Vd_1$, the voltage at the specified portion of the transparent electrode 23 becomes $Vd_1$. With regard to a potential difference between the specified portion of the transparent electrode 23 of the storage capacitor 24 and the storage capacitor electrode 25 after the time $t_1$, a difference between the voltages Vcs and $Vd_1$, is maintained, and a quantity of charges Q1 stored in the storage capacitor 24 becomes C coulomb ($Vcs-Vd_1$). Thereafter, the gate signal is applied to the TFT 22 to turn the TFT 22 to an ON state. Then, the quantity of charges Q1 stored in the storage capacitor 24 is detected by a reading circuit of the TFT array tester.

However, since the voltage Vcs supplied to the Cs line 13 is a constant voltage, when the pulse signal Vd from the signal line 15 is not applied to the storage capacitor 24, the voltage of the specified portion of the transparent electrode 23 is 0V, and the potential difference between the specified portion of the transparent electrode 23 of the storage capacitor 24 and the storage capacitor electrode 25 becomes Vcs. At this time, a quantity of charges Q2 stored in the storage capacitor 24 becomes CVcs coulomb, and the quantity of charges Q detected by the TFT array tester becomes $CVd_1$, coulomb that is a difference between Q2 and Q1. Therefore, this indicates that the quantity of charges Q is determined by writing voltages from the storage capacitor 24 and the signal line 15, and that an influence of the disconnection of the Cs line 13 is not considered.

In addition, Japanese Patent Laid-Open No. Hei 11(1999)-84420 discloses a detection method, in which resistance of each type of line is calculated by measuring a voltage and a current in each kind of line and a disconnection or a short circuit is detected by the calculated resistance values. However in this method, pads for connecting probes are required to be provided to the respective Cs lines, and the number of pads increases.

SUMMARY OF THE INVENTION

The present invention is directed to an inspection method for inspecting a disconnection of storage capacitor lines on a TFT array substrate simply in a short time and an inspection device for the same.

The gist of the inspection method for an array substrate according to the present invention is an inspection method for an array substrate, in which the array substrate includes: a substrate; a plurality of gate lines, a plurality of signal lines and a plurality of storage capacitor lines, which are disposed in an electrically nonconductive state on the substrate in the form of matrix; a plurality of switching elements electrically connected respectively to the plurality of gate lines and the plurality of signal lines; and a plurality of storage capacitors electrically connected respectively to the plurality of storage capacitor lines and the plurality of switching elements, the inspection method comprising the steps of: applying pulse signals from the plurality of storage capacitor lines to the plurality of storage capacitors; applying pulse signals from the plurality of signal lines to the plurality of storage capacitors via the plurality of switching elements; and measuring quantities of charges stored in the storage capacitors based on potential differences between the foregoing two types of pulse signals. If only the pulse signals from the foregoing signal line are applied to the foregoing storage capacitors, an influence of the disconnections of the foregoing storage capacitor lines is not considered when the quantities of charges stored in the storage capacitors are measured. In order to consider the influence of the disconnections of the foregoing storage capacitor lines, the pulse signals are also applied to the foregoing storage capacitor lines when the pulse signals are applied from the foregoing signal lines. Thus, the quantities of charges stored in the foregoing storage capacitors are determined by the pulse signals applied from the foregoing signal lines and storage capacitor lines, and the disconnections of the foregoing storage capacitor lines are detected when the quantities of charges stored in the foregoing storage capacitors are measured.

The gist of the inspection device for an array substrate according to the present invention is an inspection device for an array substrate, in which said array substrate includes: a substrate; a plurality of gate lines, a plurality of signal lines and a plurality of storage capacitor lines, which are disposed in an electrically nonconductive state on the substrate in the form of matrix; a plurality of switching elements electrically connected respectively to the plurality of gate lines and the plurality of signal lines; and a plurality of storage capacitors electrically connected respectively to the plurality of storage capacitor lines and the plurality of switching elements, the inspection device comprising: a pulse signal generating device connected to the storage capacitor lines and the signal lines in order to apply the pulse signals respectively to the plurality of storage capacitors; and a circuit for measuring the quantities of charges stored in the respective storage capacitors. By connecting the foregoing pulse signal-generating device to the foregoing signal lines and the storage capacitor lines, the pulse signal are applied to the foregoing storage capacitors from the signal lines and the storage capacitor lines. Thus, the disconnections of the storage capacitor lines can be detected by measuring the quantities of charges stored in the storage capacitors through a circuit for measuring the foregoing quantities of charges.

BRIEF DESCRIPTION OF THE DRAWINGS

Preferred embodiments of the present invention will now be described by way of example only, with reference to the accompanying drawings in which:

FIG. 6(*a*) is a graph showing the case where a disconnected portion does not exist in the Cs line; and FIG. 6(*b*) is a graph showing the case where a disconnection exists.

DETAILED DESCRIPTION OF THE PREFERRED EMBODIMENTS OF THE INVENTION

Figure 8:
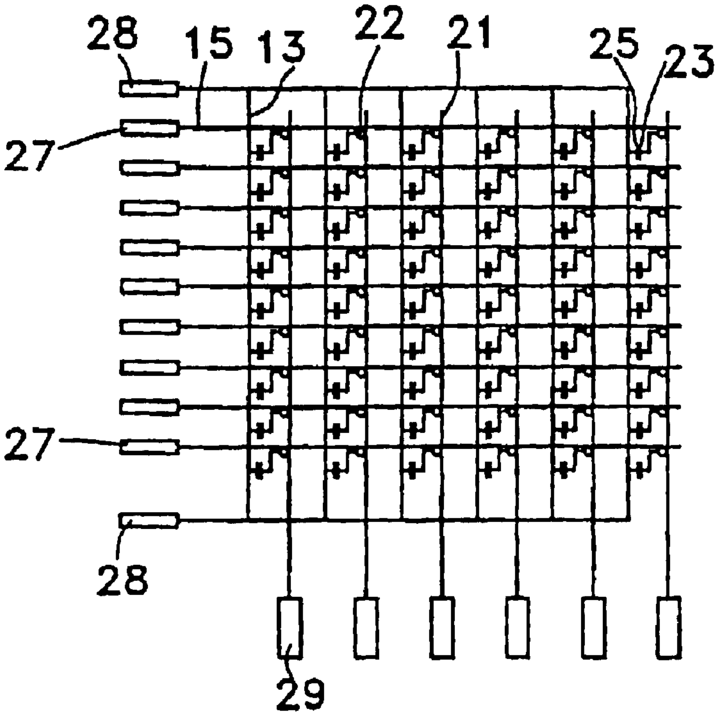
FIG. 8 PRIOR ART
FIG. 8(*a*) is an exemplary view of the TFT array substrate, and FIG. 8(*b*) is an enlarged principal portion view of the TFT array substrate.
Figure 8:
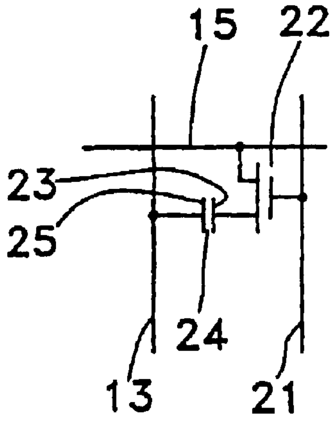
FIG. 8 PRIOR ART
Figure 9:
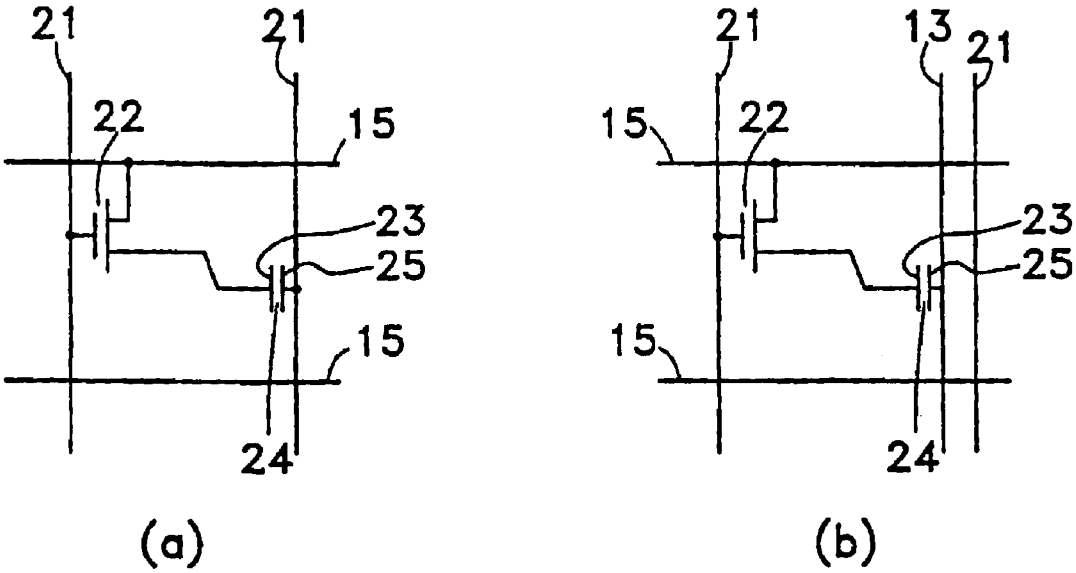
FIG.9 PRIOR ART
FIG. 9(*a*) is a constitutional view of a circuit of a drive capacitor system, and FIG. 9(*b*) is a constitutional view of a circuit of a storage capacitor system.
Figure 10:
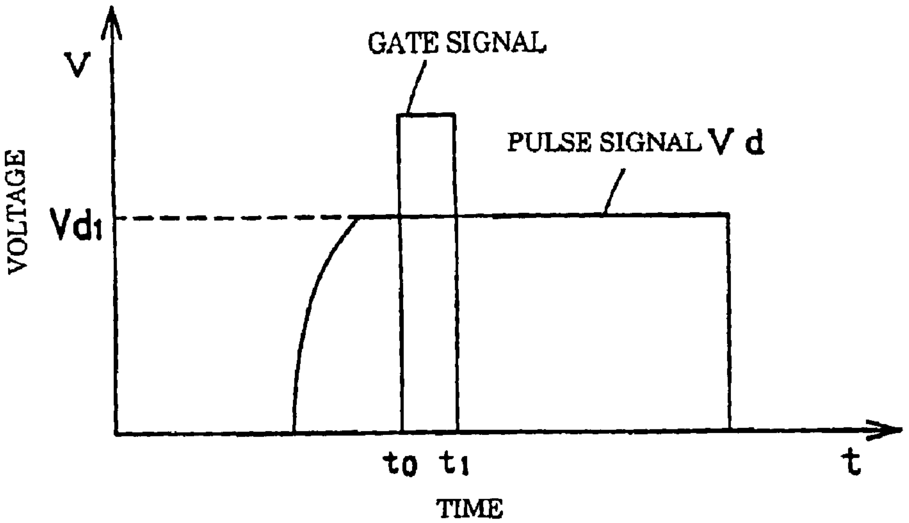
FIG. 10 PRIOR ART
FIG. 10 is a graph of signals applied to the storage capacitor in the prior art.

Next, an embodiment of the inspection method and the inspection device for a disconnection in the storage capacitor lines on the TFT array substrate according to the present invention will be described with reference to the drawings. On a TFT array substrate using the storage capacitor system, which is to be inspected, the gate lines 21, the signal lines 15 and the Cs lines 13 are wired in the form of matrix on the glass substrate, as shown in FIG. 8(*a*). The TFT 22 is arranged in the vicinity of the cross portion of the gate line 21 and the signal line 15. The transparent electrode is connected to the drain of the TFT 22. The transparent electrode is not shown. The storage capacitor electrode 25 is connected to the Cs line 13. The storage capacitor 24 is formed by arranging the specified portion of the transparent electrode 23 and the storage capacitor electrode 25 to oppose to each other.

Figure 1:
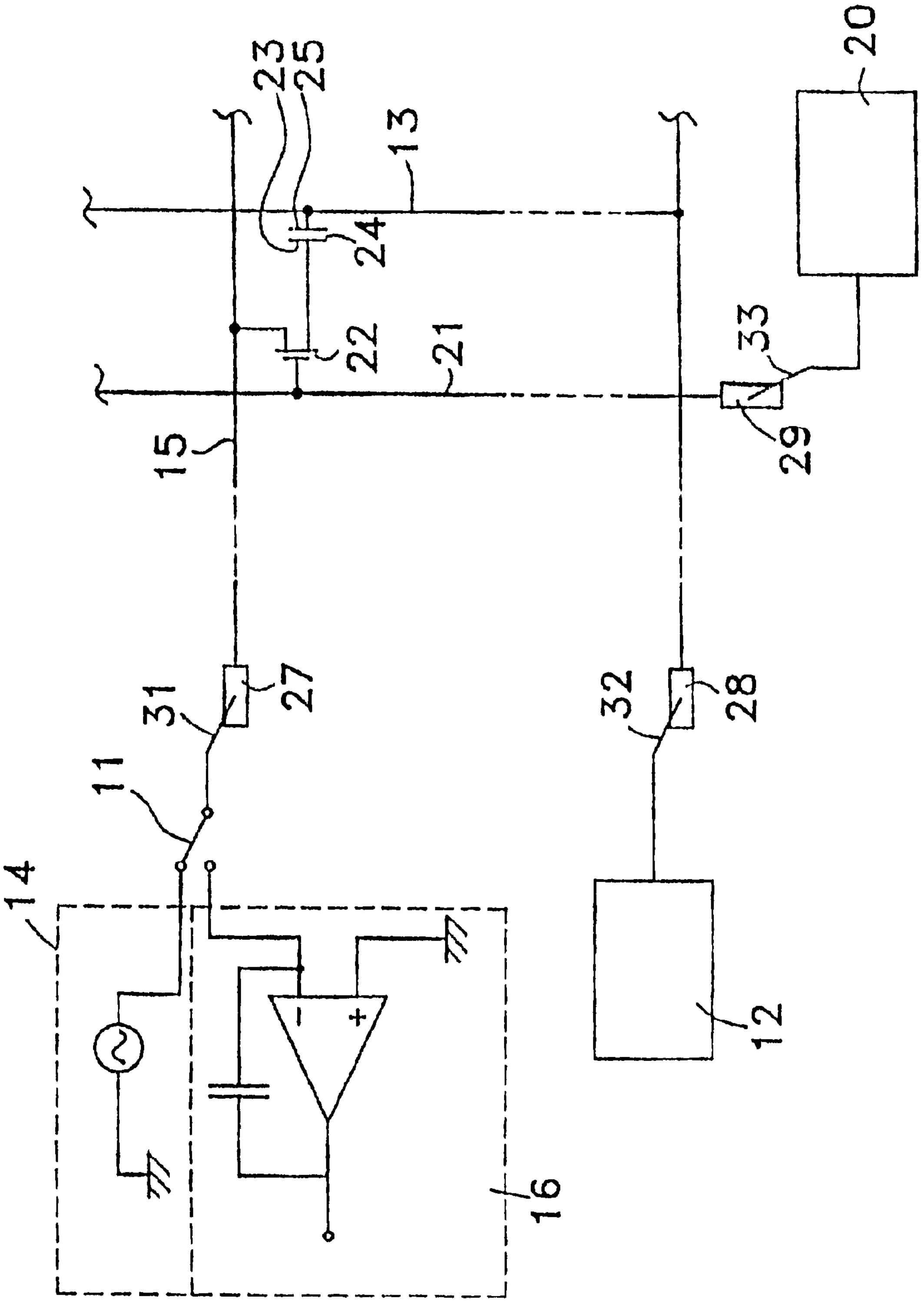
FIG. 1 is a constitutional view showing an example of an inspection device for a Cs line on a TFT array substrate according to the present invention.

FIG. 1 shows a constitutional view of an inspection device for an array substrate of the present invention. In the inspection device for an array substrate, the Cs signal generating circuit 12 is connected to the Cs line 13. The Cs signal generating circuit 12 generates the pulse signal Vcs. And, the signal line 15 is connected to a test signal generating circuit 14 and a reading circuit 16 via a switch 11. A signal supplied from the test signal generating circuit 14 to the signal line 15 is the pulse signal Vd. The switch 11 is connected to the test signal generating circuit 14 when charges are stored in the storage capacitor 24. And, the switch 11 is connected to a reading circuit 16 when the charges stored in the storage capacitor 24 are read. A gate signal generating circuit 20 generating the gate signal for driving the TFT 22 is connected to the gate line 21. The capacitance of the storage capacitor 24 is set at C.

Figure 2:
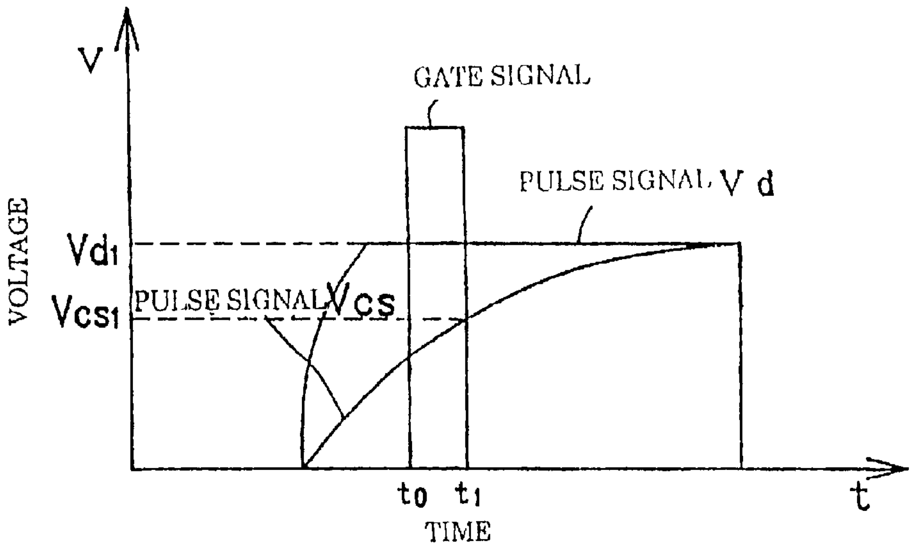
FIG. 2 is a graph showing a relation of the respective signals in a disconnection inspection of the Cs line on the TFT array substrate according to the present invention.
Figure 3:
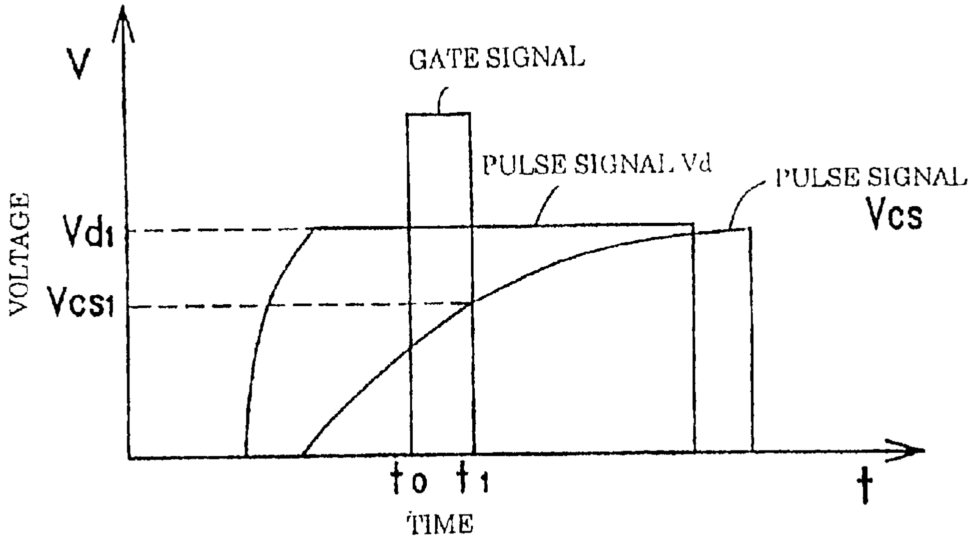
FIG. 3 is a graph showing signals supplied to the Cs line and a signal line in the case where times when the signals are supplied are staggered.

In a state where no charge is stored in the storage capacitor 24, the switch 11 shown in FIG. 1 is connected to the test signal generating circuit 14. The pulse signal Vd shown in FIG. 2 is supplied from the test signal generating circuit 14 to the signal line 15. Moreover, at the time $t_0$ in FIG. 2, the TFT 22 is turned to an ON state by supplying the gate signal from the gate signal generating circuit 20 to the TFT 22, and the pulse signal Vd is applied to the specified portion of the transparent electrode 23 of the storage capacitor 24. During the time between the time $t_0$ and $t_1$ while the gate signal is being applied to the TFT 22, the TFT 22 is in an ON state, and the pulse signal Vd is applied to the specified portion of the transparent electrode 23 of the storage capacitor 24. Furthermore, the pulse signal Vcs as shown in FIG. 2 is supplied to the Cs line 13 from the Cs signal generating circuit 12 connected to the Cs line 13. Thus, the pulse signal Vcs is applied to the storage capacitor electrode 25 of the storage capacitor 24. Rising times of the pulse signal Vd and the pulse signal Vcs are determined by the resistance of the signal line 15 and the Cs line 13 and the storage capacitor 24, and the rising times of the signals are different from each other. Also as shown in FIG. 3, if a potential difference between the Vd and the Vcs is generated when the gate signal is turned off, that is, at the time $t_1$, it is possible to stagger supply times of the pulse signal Vd and the pulse signal Vcs to the signal line 15 and the Cs line 13.

As described above, by applying the pulse signal Vd and the pulse signal Vcs respectively to the specified portion of the transparent electrode 23 of the storage capacitor 24 and the storage capacitor electrode 25, a potential difference is generated between the specified portion of the transparent electrode 23 and the storage capacitor electrode 25. And then, the gate signal is turned off at the time $t_1$ in FIG. 2 to turn the TFT 22 to the OFF state. At this time, a voltage of the pulse signal Vd applied to the specified portion of the transparent electrode 23 of the storage capacitor 24 is defined to be $Vd_1$, and a voltage of the pulse signal Vcs applied to the storage capacitor electrode 25 is defined to be $Vcs_1$. Therefore, the potential difference generated between the specified portion of the transparent electrode 23 of the storage capacitor 24 and the storage capacitor electrode 25 becomes $Vcs_1-Vd_1$. The quantity of charges Q1 of C $(Vcs_1-Vd_1)$ coulomb is stored in the storage capacitor 24 by maintaining the potential difference.

Note that, in FIG. 2, the pulse signal Vd and the pulse signal Vcs, which are supplied respectively to the signal line 15 and the Cs line 13, are made to fall in an optional time between the time $t_1$ when the TFT 22 is turned to an OFF state by the gate signal and the time when the gate signal is applied to the TFT 22 and the quantity of charges stored in the storage capacitor 24 is read out.

After the charges are stored in the storage capacitor 24 by the above-described process, the switch 11 is connected to the reading circuit 16 in order to read the quantity of charges stored in the storage capacitor 24. And, by supplying the gate signal to the TFT 22, the TFT 22 is turned to an ON state while the gate signal is being supplied to the TFT 22, the charges stored in the storage capacitor 24 are supplied to the reading circuit 16, the quantity of charges stored in the storage capacitor 24 is measured.

When the respective pulse signals Vd and Vcs are not applied to the specified portion of the transparent electrode 23 of the storage capacitor 24 and the storage capacitor electrode 25, the quantity of charges Q2 stored in the storage capacitor 24 is 0 coulomb, and the quantity of charges Q=Q2−Q1 detected by the reading circuit 16 is C $(Vd_1-Vcs_1)$ coulomb. Therefore, the pulse signal Vcs applied to the Cs line 13, which has not been included in the prior art, is considered. Specifically, by previously determining a reference range of the quantity of charges Q in the case where the Cs line is not disconnected, a value of the quantity of charges Q does not fall within the reference range because the value of $Vcs_1$ does not reach the reference value when the Cs line 13 is disconnected. Thus, detecting the disconnection of the Cs line becomes enabled.

Note that, in the disconnection inspection for the Cs line 13, the value of the quantity of charges Q changes also by the disconnection of the signal line 15 or the like, as well as the influence from the disconnection of the Cs line 13. Accordingly, it is preferable to perform the inspection for a disconnection, a short circuit and a defective resistance in each type of line, a pixel defect or the like before performing the inspection for the disconnection of the Cs line 13.

Figure 4:
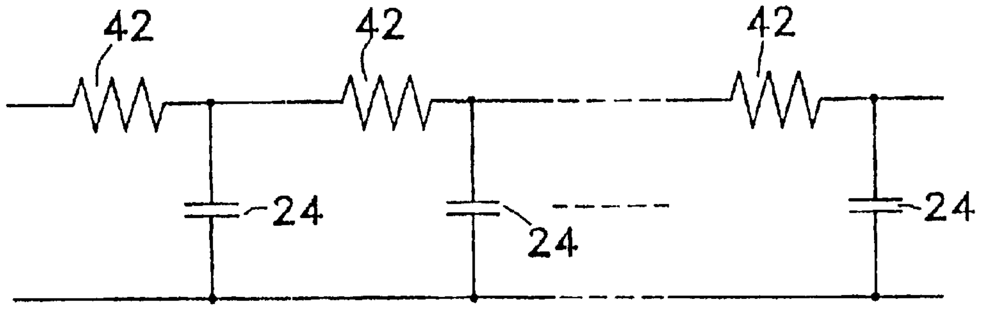
FIG. 4 is a view of an equivalent circuit of the Cs line and storage capacitors.
Figure 5:
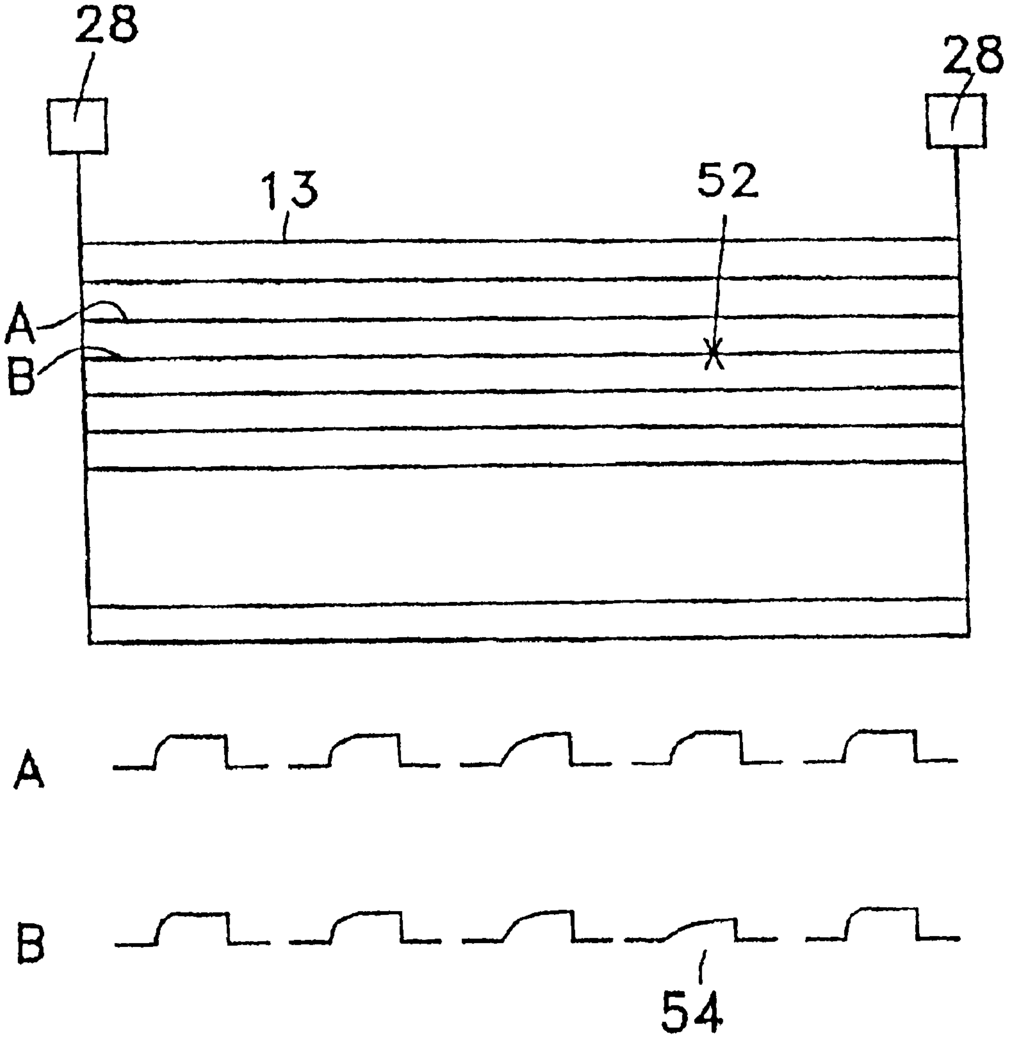
FIG. 5 is a view showing a relation between the Cs line and a pulse signal applied from the Cs line to the storage capacitor.

The storage capacitors 24 are multi-connected to one Cs line 13 in parallel, which are illustrated by an equivalent circuit with resistors 42 of the Cs lines 13 as shown in FIG. 4. Therefore, since the rising times of the pulses of the pulse signal Vcs from the Cs line 13 vary depending on the positions of the storage capacitors 24, the above-described $Vcs_1$ varies, thus the quantity of charges stored in each storage capacitor 24 also varies. FIG. 5 shows a relation between the Cs lines 13 and the pulse signals Vcs. In FIG. 5, storage capacitors, TFTs, signal lines, gate lines and the like are omitted. The pulse signals Vcs are applied from the both ends of the Cs line 13. Therefore, if the Cs line 13 is not disconnected like 'A' line, the rising time of the pulse of the pulse signal Vcs applied to the storage capacitor 24 at the center of the CS line 13 is the longest, and the rising times of the pulses of the pulse signals Vcs applied to the storage capacitors 24 at the both ends of the Cs line 13 are the shortest.

However, in the case where the Cs line 13 is disconnected like 'B' line in FIG. 5, the rising time of the pulses of the pulse signal Vcs 54 applied to the storage capacitor 24 in the vicinity of a disconnected portion 52 becomes long. This is because, even if the pulse signals Vcs are applied from the both ends of the Cs line 13, the pulse signal Vcs stops at the disconnected portion 52 and the pulse signal Vcs from the reverse direction is applied. Accordingly, this causes some storage capacitors 24 to store different quantities of charges from the ones stored in the storage capacitors 24 when the Cs line 13 is not disconnected.

Figure 6:
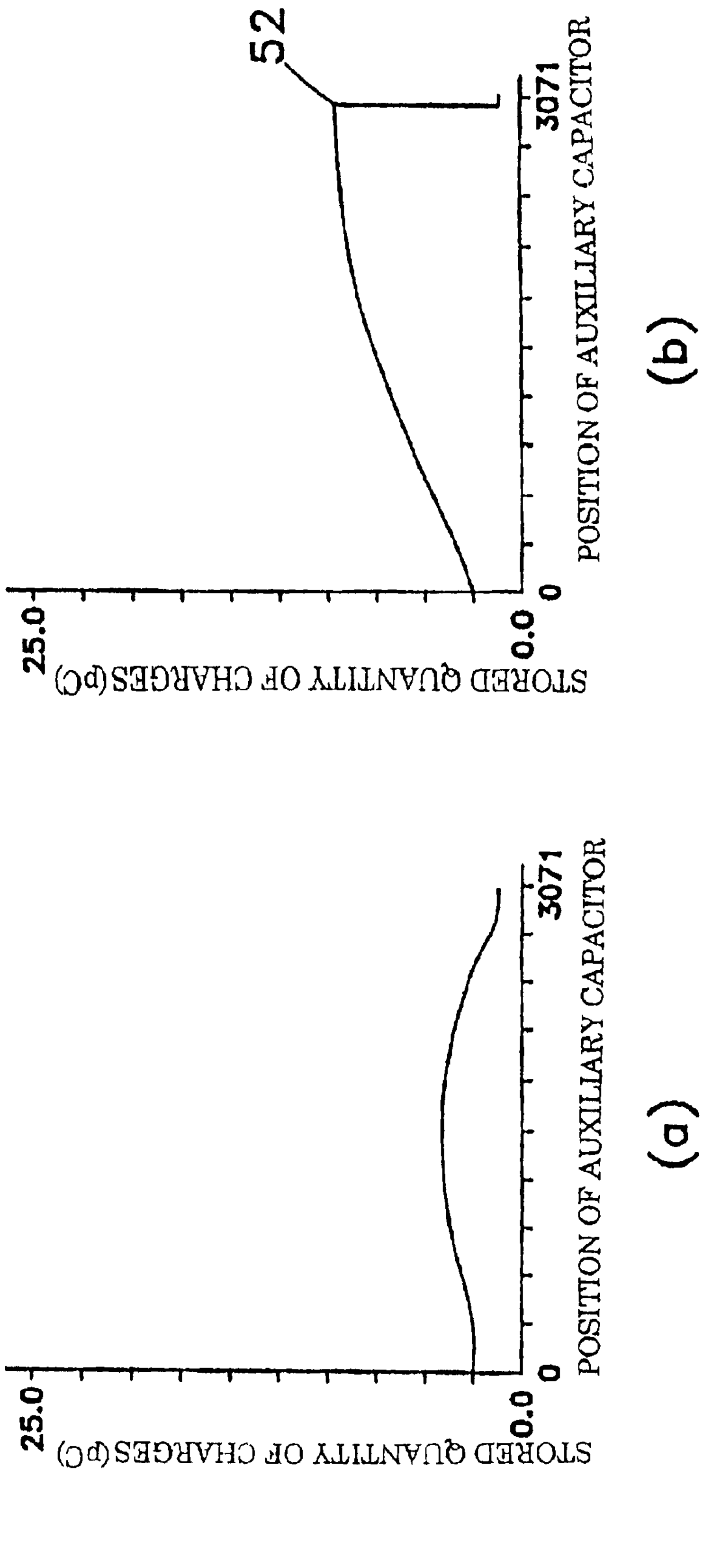
FIGS. 6(*a*) and 6(*b*) are graphs showing relations between positions of the storage capacitors and quantities of stored charges.

FIGS. 6(*a*) and 6(*b*) show relations between positions of the storage capacitors 24 and the quantities of charges stored in the respective storage capacitors 24 in extended Graphics Array (XGA) liquid crystal display panels from 14 inch diagonal to 17 inch diagonal in the cases where the disconnection in the Cs line 13 does not exist and does exist. In FIG. 6, an abscissa denotes the positions of the storage capacitors 24. In the XGA liquid crystal display panels from 14 inch diagonal to 17 inch diagonal, the number of storage capacitors 24 connected to one Cs line 13 is 3072, the storage capacitor 24 connected to either one end of the Cs line 13 is denoted by 0, and the storage capacitor 24 connected to the other end is denoted by 3071. When FIGS. 6(*a*) and 6(*b*) are compared with each other, the difference of quantities of charges stored in the storage capacitor 24 becomes more significant as the position of the storage capacitor 24 is closer to the disconnected portion 52 shown in FIG. 5. Moreover, in FIG. 6(*b*), a significant difference occurs in the quantity of charges stored in the storage capacitor 24 near the disconnected portion 52. Therefore, by comparing a result of an actual disconnection inspection with the case where a disconnection does not exist, it is possible to detect the disconnection of the Cs line 13. Alternatively, it is possible to detect the disconnection of the Cs line 13 also by detecting whether or not a significant difference occurs in the detected quantities of charges.

In the case where the disconnection is detected by the above-described method, the same inspection needs to be executed for all the storage capacitors 24 for each Cs line 13. However, when FIGS. 6(*a*) and 6(*b*) are compared with each other, a difference can be found in the detected quantities of charges in portions other than the disconnected portion 52. For example, it is possible to detect the disconnection by detecting only the quantity of charges of the storage capacitor 24 connected to the center of the Cs line 13. In other words, the quantities of charges of the respective storage capacitors 24 connected via the TFTs 22 connected to one signal line 15 are detected. By use of this method, a need to detect all of the quantities of charges of the storage capacitors 24 is eliminated, thus the time required for the disconnection inspection is shortened. For example, in the case of the XGA liquid crystal display panels from 14 inch diagonal to 17 inch diagonal or the like, the detection of the quantity of charges is not necessarily performed for all 3072 storage capacitors 24 connected to one Cs line 13, but the above-described inspection may be satisfactorily executed for one storage capacitor 24. An inspection time required for the disconnection inspection for all the 768 Cs lines 13, in which the detection for the quantity of charges of one storage capacitor 24 for each of all 768 Cs lines 13 of the XGA liquid crystal display panel is performed, is about 1 to 2 seconds. As such, the inspection is terminated in a short time.

Figure 7:
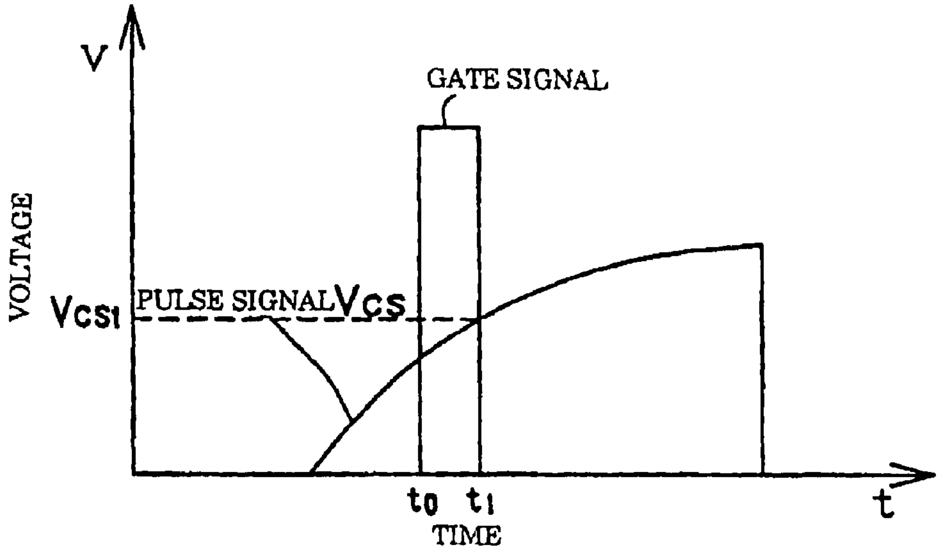
FIG. 7 is a graph showing the case where a pulse signal Vcs is supplied to the Cs line and a pulse signal Vd is not supplied to the signal line.

As above, description has been made for one embodiment of the inspection method and the inspection device for an array substrate according to the present invention. However, the present invention is not limited to this embodiment. As another embodiment, an inspection method will be described, in which the pulse signal Vd is not supplied to the signal line 15, but the pulse signal Vcs is supplied to the Cs line 13. Since the pulse signal Vd is not supplied to the signal line 15, the switch 11 shown in FIG. 1 is connected to the reading circuit 16. Note that, it is also possible to directly connect the reading circuit 16 to the signal line 15 without using the switch 11 and the test signal generating circuit 14. When the pulse signal Vcs as shown in FIG. 7 is supplied to the Cs line 13, the pulse signal Vcs is applied to the storage capacitor electrode 25. Since the pulse signal Vd is not applied to the specified portion of the transparent electrode 23, the voltage of the specified portion of the transparent electrode 23 becomes 0V.

In FIG. 7, the gate signal is supplied to the gate line 21 at the time $t_0$ to turn the TFT 22 to an ON state. By turning the TFT 22 to an ON state, the charges stored in the storage capacitor 24 pass through the signal line 15 and are read in the reading circuit 16. And then, by turning off the gate signal at the time $t_1$ in FIG. 7, the TFT 22 turns to an OFF state. Thus, the reading of the charges stored in the storage capacitor 24, which is performed through the signal line 15 by the reading circuit 16, is discontinued. When the voltage of the pulse signal Vcs at the time $t_1$ is defined as $Vcs_1$, the potential difference between the storage capacitor electrode 25 of the storage capacitor 24 and the specified portion of the transparent electrode 23 becomes $Vcs_1$. Therefore, the quantity of charges $Q_1$ stored in the storage capacitor 24 becomes $CVcs_1$ coulomb.

The quantity of charges Q2 stored in the storage capacitor 24 when the pulse signal Vcs is not applied to the storage capacitor electrode 25 becomes 0 coulomb because the potential difference between the storage capacitor electrode 25 and the specified portion of the transparent electrode 23 is 0V. Accordingly, the quantity of charges Q stored in the storage capacitor 24 and read by the reading circuit 16 at the time $t_1$ is $Q_2-Q_1=-CVcs_1$ coulomb. The pulse signal Vcs supplied to the Cs line is taken into consideration.

The time $t_1$ in FIG. 7 is an optional timing in the rising time of the pulse of the pulse signal Vcs. Also as shown in the above-described embodiment, the measurement of the quantity of charges is performed not for all the storage capacitors 24 connected to the Cs lines 13 but for one optional storage capacitor 24. Specifically, the measurement of the quantities of stored charges is performed for all the storage capacitors 24 connected to one signal line 15 via the TFT 22. By measuring the quantity of charges of one storage capacitor 24 for each of all the Cs lines 13, the disconnection inspection for all the Cs lines 13 on the TFT array substrate is terminated in a short time.

The present invention can be embodied in an aspect in which various improvements, modifications and transformations are added based on the knowledge of those skilled in the art without departing from the spirit of the invention.

In the inspection method of the array substrate according to the present invention, it is possible to inspect the disconnection of the Cs line by supplying the pulse signal to the Cs line as well as the pulse signal to the signal line. Therefore, array substrates having disconnected Cs lines thereon, which heretofore have flown into a subsequent process, can be prevented from flowing into the subsequent process. The inspection time for the disconnection of the Cs line also can be terminated in a short time.

In addition, to the inspection device of the array substrate according to the present invention, only the circuit for supplying the pulse signal to the Cs line is newly added, and no complex inspection device is added. Accordingly, similarly to the prior art, detecting of the disconnection of the Cs line is enabled by reading the quantity of charges of the storage capacitor.

While the invention has been particularly shown and described with respect to preferred embodiments thereof, it will be understood by those skilled in the art that the foregoing and other changes in form and details may be made therein without departing form the spirit and scope of the invention.

Having thus described my invention, what I claim as new and desire to secure by letters patent is:

1. An inspection method for an array substrate, in which said array substrate includes: a substrate; a plurality of gate lines, a plurality of signal lines and a plurality of storage capacitor lines with each storage capacitor line having two ends, which are disposed in an electrically nonconductive state on the substrate in the form of matrix; a plurality of switching elements electrically connected respectively to the plurality of gate lines and the plurality of signal lines; and a plurality of storage capacitors electrically connected respectively to said plurality of storage capacitor lines and said plurality of switching elements, said inspection method comprising the steps of:

applying pulse signals from both ends of said plurality of storage capacitor lines to said plurality of storage capacitors such that in a connected storage capacitor line the storage capacitors located near each end of the storage capacitor line have a stored voltage whch rises relatively fast and the storage capacitors located near the center of the storage capacitor line have a stored voltage which rises relatively slowly compared to the storage capacitors located near each end of the storage capacitor line, and in a disconnected storage capacitor line having a disconnection, storage capacitors located near the disconnection have a stored voltage which rises relatively slowly compared to similarly located storage capacitors in a connected storage capacitor line;

applying pulse signals from said plurality of signal lines to said plurality of storage capacitors via said plurality of switching elements; and measuring quantities of charges stored in the storage capacitors based on potential differences between said two types of pulse signals.

2. The inspection method for an array substrate according to claim 1, wherein the pulse signals applied from said plurality of storage capacitor lines to said plurality of storage capacitors and the pulse signals applied from said plurality of signal lines to said plurality of storage capacitors via said plurality of switching elements are simultaneously applied to said plurality of storage capacitors.

3. The inspection method for an array substrate according to claim 2, wherein the pulse signals applied from said plurality of storage capacitor lines to said plurality of storage capacitors and the pulse signals applied from said plurality of signal lines to said plurality of storage capacitors via said plurality of switching elements have pulse rising times different from each other.

4. The inspection method for an array substrate according to claim 1, wherein the pulse rising times of the pulse signals applied from said plurality of storage capacitor lines to said plurality of storage capacitors are respectively different in said plurality of storage capacitors.

5. The inspection method for an array substrate according to claim 1, wherein in said measuring step, the quantity of charges stored in only one single storage capacitor among said plurality of storage capacitors electrically connected to said storage capacitor lines is measured.

6. The inspection method for an array substrate according to claim 5, wherein measuring of the quantity of charges stored in said only one single storage capacitor is performed for all of said plurality of storage capacitor lines.

7. The inspection method for an array substrate according to claim 1, wherein in said measuring step, the quantities of charges stored in said plurality of storage capacitors connected to said signal lines via said plurality of switching elements are measured.

8. An inspection method for an array substrate, in which said array substrate includes: a substrate; a plurality of gate lines, a plurality of signal lines and a plurality of storage capacitor lines with each storage capacitor line having two ends, which are disposed in an electrically nonconductive state on the substrate in the form of matrix; a plurality of switching elements electrically connected respectively to the plurality of gate lines and the plurality of signal lines; and a plurality of storage capacitors electrically connected respectively to said plurality of storage capacitor lines and said plurality of switching elements, said inspection method comprising the steps of:

applying pulse signals from both ends of said plurality of storage capacitor lines to said plurality of storage capacitors such that in a connected storage capacitor line the storage capacitors located near each end of the storage capacitor line have a stored voltage whch rises relatively fast and the storage capacitors located near the center of the storage capacitor line have a stored voltage which rises relatively slowly compared to the storage capacitors located near each end of the storage capacitor line, and in a disconnected storage capacitor line having a disconnection, storage capacitors located near the disconnection have a stored voltage which rises relatively slowly compared to similarly located storaae capacitors in a connected storage capacitor line; and measuring quantities of charges stored in the storage capacitors based on potential differences between said pulse signals.

9. The inspection method for an array substrate according to claim 8, wherein the pulse rising times of the pulse signals applied from said plurality of storage capacitor lines to said plurality of storage capacitors are respectively different in said plurality of storage capacitors.

10. The inspection method for an array substrate according to claim 8, wherein in said measuring step, the quantity of charges stored in only one single storage capacitor among said plurality of storage capacitors electrically connected to said storage capacitor lines is measured.

11. The inspection method for an array substrate according to claim 10, wherein measuring of the quantity of charges stored in said only one single storage capacitor is performed for all of said plurality of storage capacitor lines.

12. The inspection method for an array substrate according to claim 8, wherein in said measuring step, the quantities of charges stored in said plurality of storage capacitors connected to said signal lines via said plurality of switching elements are measured.

13. An inspection device for an array substrate, in which said substrate includes: a substrate; a plurality of gate lines, a plurality of signal lines and a plurality of storage capacitor lines with each storage capacitor line having two ends, which are disposed in an electrically nonconductive state on the substrate in the form of matrix; a plurality of switching elements electrically connected respectively to the plurality of gate lines and the plurality of signal lines; and a plurality of storage capacitors electrically connected respectively to said plurality of storage capacitor lines and said plurality of switching elements, said inspection device comprising:

a pulse signal generating device connected to both ends of said storage capacitor lines and a pulse signal generating device connected to said signal lines in order to apply the pulse signals respectively to said plurality of storage capacitors such that in a connected storage capacitor line the storage capacitors located near each end of the storage capacitor line have a stored voltage whch rises relatively fast and the storage capacitors located near the center of the storage capacitor line have a stored voltage which rises relatively slowly compared to the storage capacitors located near each end of the storage capacitor line, and in a disconnected storage capacitor line having a disconnection, storage capacitors located near the disconnection have a stored voltage which rises relatively slowly compared to similarly located storage capacitors in a connected storage capacitor line; and a circuit for measuring the quantities of charges stored in said respective storage capacitors.

14. The inspection device for an array substrate according to claim 13, wherein said circuit for measuring the quantities of charges stored in said storage capacitors is connected to said signal lines.

15. An inspection device for an array substrate, in which said array substrate includes: a substrate; a plurality of gate lines, a plurality of signal lines and a plurality of storage capacitor lines with each storage capacitor line having two ends, which are disposed in an electrically nonconductive state on the substrate in the form of matrix; a plurality of switching elements that are electrically connected to each of the plurality of gate lines and each of the plurality of signal lines; and a plurality of storage capacitors electrically connected respectively to said plurality of storage capacitor lines and said plurality of switching elements, said inspection device comprising:

a pulse signal generating device connected to both ends of said storage capacitor lines in order to apply the pulse signals respectively to said plurality of storage capacitors such that in a connected storage capacitor line the storage capacitors located near each end of the storage capacitor line have a stored voltage whch rises relatively fast and the storage capacitors located near the center of the storage capacitor line have a stored voltage which rises relatively slowly compared to the storage capacitors located near each end of the storage capacitor line, and in a disconnected storage capacitor line having a disconnection, storage capacitors located near the disconnection have a stored voltage which rises relatively slowly compared to similarly located storage capacitors in a connected storage capacitor line; and a circuit for measuring the quantities of charges stored in said respective storage capacitors.

16. The inspection device for an array substrate according to claim 15, wherein said circuit for measuring the quantities of charges stored in said storage capacitors is connected to said signal lines.

* * * * *